United States Patent [19]
Tanabe et al.

[11] Patent Number: 5,584,045
[45] Date of Patent: Dec. 10, 1996

[54] POLYCRYSTALLINE DIAMOND TOOL AND METHOD FOR PRODUCING SAME

[75] Inventors: Keiichiro Tanabe; Naoji Fujimori, both of Hyogo, Japan

[73] Assignee: Sumitomo Electric Industries, Ltd., Osaka, Japan

[21] Appl. No.: 554,100

[22] Filed: Nov. 6, 1995

Related U.S. Application Data

[63] Continuation of Ser. No. 353,356, Dec. 2, 1994, abandoned, which is a continuation of Ser. No. 796,345, Nov. 22, 1991, abandoned.

[30] Foreign Application Priority Data

Nov. 22, 1990 [JP] Japan ............................ 2-319210

[51] Int. Cl.$^6$ ............................................ B22F 3/00
[52] U.S. Cl. ................ 428/547; 428/548; 428/552; 428/565; 51/306; 51/307; 51/309; 76/DIG. 12; 125/39; 175/434; 407/119; 408/144
[58] Field of Search .................................... 428/547, 548, 428/551, 552, 565; 125/30.01, 39; 76/DIG. 12; 175/434; 407/118, 119; 408/144, 145; 51/293, 306, 307, 309; 427/585

[56] References Cited

U.S. PATENT DOCUMENTS

| | | | |
|---|---|---|---|
| 4,151,686 | 5/1979 | Lee et al. | 51/307 |
| 4,504,284 | 3/1985 | Ohno | 51/309 |
| 4,604,106 | 8/1986 | Hall et al. | 51/293 |
| 4,694,918 | 9/1987 | Hall | 175/329 |
| 4,729,440 | 3/1988 | Hall | 175/107 |
| 4,766,040 | 8/1988 | Hillert | 428/552 |
| 4,884,476 | 12/1989 | Okuzumi et al. | 76/101 R |
| 4,919,974 | 8/1990 | McCone et al. | 427/249 |
| 4,959,929 | 10/1990 | Burnand et al. | 51/307 |
| 4,985,051 | 1/1991 | Ringwood | 51/309 |
| 5,011,509 | 4/1991 | Frushour | 51/293 |
| 5,020,394 | 6/1991 | Nakamura et al. | 76/108.6 |
| 5,064,682 | 11/1991 | Kiyama et al. | 427/38 |
| 5,071,677 | 12/1991 | Patterson et al. | 427/249 |
| 5,139,372 | 8/1992 | Tanabe et al. | 407/118 |
| 5,225,275 | 7/1993 | Aida | 428/334 |
| 5,248,317 | 9/1993 | Tank et al. | 51/293 |
| 5,266,409 | 11/1993 | Schmidt et al. | 428/446 |
| 5,335,738 | 8/1994 | Waldenstrom et al. | 175/420.2 |

FOREIGN PATENT DOCUMENTS

| | | |
|---|---|---|
| 52-12126 | 4/1977 | Japan . |
| 53-114589 | 10/1978 | Japan . |
| 58-91100 | 5/1983 | Japan . |
| 1153228 | 6/1989 | Japan . |
| 1210201 | 8/1989 | Japan . |
| 222471 | 1/1990 | Japan . |

Primary Examiner—Harvey E. Behrend
Assistant Examiner—Chrisman D. Carroll
Attorney, Agent, or Firm—Cushman Darby & Cushman, L.L.P.

[57] ABSTRACT

Polycrystalline diamond has non-uniform impurity concentration along the direction of thickness. The diamond near the rake surface has a lower impurity concentration. The diamond near the fixation surface has a higher impurity concentration. The diamond with the higher impurity concentration near the fixation surface alleviates strong stress or absorbs external shock. Owing to the higher impurity concentration of diamond near the fixation surface, the diamond tool excels in chip resistance or toughness. The diamond with a lower impurity concentration near the rake surface heightens abrasion resistance, adhesion resistance and strength.

18 Claims, 4 Drawing Sheets

POLYCRYSTALLINE DIAMOND TOOL AND METHOD FOR PRODUCING SAME

This is a continuation of application Ser. No. 08/353,356, filed on Dec. 2, 1994, now abandoned, which is a continuation of Ser. No. 07/796,345, filed Nov. 22, 1991, now abandoned.

FIELD OF THE INVENTION

This invention relates to a polycrystalline diamond tool which excels in strength, abrasion resistance, chip resistance, adhesion resistance and heat resistance and is suitable for cutting tools or abrasion resistance tools.

BACKGROUND OF THE INVENTION

All polycrystalline diamonds for tools have hitherto been produced by the sintering method. Namely, diamond powder—polycrystalline diamond granules—is charged in a mold, is put tinder high pressure, is heated to a high temperature and is kept For a certain time at the high temperature under high pressure. Diamond granules are coupled together by the action of the heat and the pressure. Thus powder is integrated into a body. The shape of the sintered body is determined by the mold. Sintered diamond has been used on cutting devices for nonferrous metals, drill bits and drawing dies.

For example, the Japanese Patent Publication No. 52-12126 disclosed a sintered body of diamond including cobalt by about 10 to 15 volume percent which was made by sintering diamond powder being kept in contact with the cemented carbide of group WC-Co (tungsten carbide-cobalt), diffusing some part of cobalt into the diamond powder as a binder metal. The sintered diamond body including cobalt as solid solution is gifted with a practical utility for cutting tools for nonferrous metals. In general, since diamond has the tendency to be alloyed with iron or steel, diamond tool is not used on cutting ferrous metals.

However, the sintered diamond has a drawback of the poor heat resistance. The abrasion resistance and the strength of the sintered body of diamond are greatly lowered by being heated above 700° C. The sintered body of diamond is destroyed by being heated above 900° C.

Single crystal diamond or polycrystalline diamond has high heat resistance. Why is the heat resistance of the sintered diamond so poor? One reason is that diamond is partly converted to graphite on the boundary between the diamond granules and the cobalt solid solution at high temperature. Conversion of diamond into graphite lowers the strength and the abrasive resistance, because graphite is weaker than diamond in strength. Another reason is that the difference of the thermal expansion between cobalt and diamond generates strong thermal tension at the boundary between the diamond granules and the cobalt solid solution.

To improve the poor heat resistance of the sintered body of diamond, the Japanese Patent Laying Open No. 53-114589 proposed a sintered body of diamond which is rid of cobalt as a binder metal by treating the sintered diamond body with acid. The sintered diamond body must be immune from the problems of the graphite conversion and the thermal tension which would occur at the boundary of the diamond granules and the cobalt solid solution, since the sintered body includes no cobalt. However, the sintered diamond body without cobalt becomes severely porous, because the spaces where cobalt has occupied are left as holes after cobalt is dissolved away by acid. Although the heat resistance is raised by washing cobalt away, the mechanical strength of the sintered body is lowered because of the porosity. The diamonds produced by the sintering method are accompanied by these drawbacks. The sintering method at present cannot satisfy the requirements of both mechanical strength and heat resistance.

Recently, a new technology which enables us to synthesize diamond polycrystals chemically from vapor phase has been developed. This technology is called a chemical vapor phase deposition (CVD) method or simply a vapor phase synthesis. The method comprises the steps of diluting hydrocarbon gas with hydrogen gas to less than 5 volume percent, introducing the mixture gas into a reactor under the pressure of several tens Tort (several thousands Pa), exciting the material gas for resolving it to an active state by some means and depositing diamond on the substrate heated at a certain temperature. With regard to the means for exciting the material gas, various means have been proposed, e.g. heating by filament heater or exciting the material gas by electrons or plasma. Some different CVD methods have been proposed according to the means for excitation of material gas.

The Japanese Patent Laying Open No. 58-91100 ('83) proposed a method comprising the steps of preheating the material gas by a hot electron emission material heated above 1000° C., introducing the preheated material gas onto a heated substrate, resolving hydrocarbon to active states, e.g. ions, electrons and neutral radicals and depositing a diamond polycrystal on the substrate.

The Japanese Patent Laying Open No. 58-110494 ('83) proposed a method comprising the steps of exciting hydrogen gas into plasma by the microwave electrodeless discharge, mixing the plasma-excited hydrogen with hydrocarbon gas and depositing a diamond polycrystal on a heated substrate.

Thus, there are various kinds of the CVD methods for growing diamond crystals according to the means for excitation Diamond polycrystals are grown by the CVD methods. There are two ways for applying the diamond polycrystals to tools. One is separating the diamond polycrystal from the substrate and fitting the diamond polycrystal to an end of a tool. The other is depositing the diamond polycrystal directly on an edge of a tool instead of a substrate. The edge of the tool is reinforced by the diamond coating.

Japanese Patent Laying Open No. 1-153228 ('89) and the Japanese Patent Laying Open No. 1-210201 ('89) proposed a method for producing a diamond tool comprising the steps of depositing a diamond polycrystal on a substrate by a chemical vapor deposition (CVD) method, etching the substrate away with acid or other pertinent solution and fitting the separated diamond polycrystal to an edge of a tool which is made of metal. However, the diamond tool consisting of a diamond edge and a metal body lacks chip resistance and abrasion resistance. The "chip resistance" is here defined as the strength for keeping its shape against an external shock without being cracked away. Low chip resistance means being likely to be cracked by an external shock. The "abrasion resistance" is here defined as the strength against abrasion. Low abrasion resistance means being likely to be abraded easily. Intrinsically diamond should have high abrasion resistance and high chip resistance, but the diamond crystal synthesized by the present CVD methods is not endowed with the high abrasion resistance and high chip resistance by some unknown reasons.

The tools whose edge is coated with polycrystalline diamond have also been proposed. On whole of a tool or on a part of a tool as a substrate, diamond polycrystal is grown by the CVD method. Since the edge of the tool is coated with diamond, the edge would have enough strength. However, the CVD coated tools in practice show poor performance— weak strength, low chip resistance and low abrasion resistance. The reason of the poor performance is partly because the diamond polycrystal is too thin, partly because the adhesion force between the diamond and the tool metal is insufficient and partly because the diamond is likely to peel off from the metal surface. However, it is difficult to heighten the adhesion strength, since the tool metal and the diamond are totally different with regard to many physical or chemical properties, e.g. crystal structure, conductivity, thermal expansion.

The Japanese Patent Laying Open No. 2-22471 ('90) proposed an improved CVD coated tool. The adhesion strength is heightened by coating a cemented carbide tool with an improved diamond compound. However, such a diamond coated tool often shows poor cutting performance dependent on the roughness of the object to be cut. Further, the cutting performance of the tool is totally insufficient, when it cuts the hard objects with high cutting resistance, e.g. Al—17% Si alloy (Al 83%, Si 17%), Al—25% Si alloy (Al 75%, Si 25%).

One purpose of the invention is to provide a polycrystalline diamond tool with high strength, high adhesion resistance, high heat resistance, and high abrasion resistance.

Another purpose of the invention is to provide a polycrystalline diamond tool which excels in chip resistance and abrasion resistance for cutting the hard objects with high cutting resistance.

Another purpose of the invention is to provide a method for producing a polycrystalline diamond with high strength, high adhesion resistance, high heat resistance and high abrasion resistance.

SUMMARY OF THE INVENTION

The polycrystalline diamond tool of this invention comprises a tool body with an end having an end surface and a diamond polycrystal plate for fitting on the end surface of the tool body, the diamond polycrystal plate being more than 40 μm in thickness, wherein the impurity concentration of the diamond plate changes in the direction vertical to the surfaces, (i.e. in the direction of thickness), the impurity concentration ($X_\square\%$) at the rake surface is lower than the impurity concentration ($Y_\square\%$) at the fixation surface. Namely $X_\square < Y_\square$ is the characteristic of this invention. Lower impurity concentration of diamond at the rake surface gives the diamond plate high strength, high abrasion resistance and high adhesion resistance. On the contrary, higher impurity concentration at the fixation surface heightens the chip resistance by alleviating the stress applied on the rake surface, since higher impurity concentration heightens the toughness because of the low rigidity owing to the numerous impurities.

Both the diamond near the rake surface and the diamond near the fixation surface cooperate to give the tool ideal characteristics by compensating the weak points of the counterparts with their strong points. Therefore, the essential feature of this invention depends on a complementary principle between the rake surface and the fixation surface.

All the CVD deposited diamonds of the prior art have uniform impurity concentration. However, the diamond of this invention has varying impurity concentration in the direction of thickness (vertical to the plane): higher impurity concentration at the fixation surface for being mounted on an edge of a tool and lower impurity concentration at the rake surface for cutting objects.

An easy method for fabricating a diamond plate with the impurity concentration varying in the direction of thickness is varying the component of material gas during the deposition. At an earlier stage of deposition, pure hydrocarbon and hydrogen gases should be supplied. At a later stage, a gas including an impurity should be mixed into hydrocarbon and hydrogen gases.

Although this invention has been defined by the impurity concentration only of both surfaces of diamond so far, this invention can also be defined by the impurity concentration of partial regions with a certain depth from the rake surface and the fixation surface.

The average impurity concentration in a partial region within a depth of 30% of total thickness from the rake surface is designated by $X_1$. The average impurity concentration in another partial region within a depth of 30% of total thickness from the fixation surface is designated by $Y_1$. This invention can be also defined by another inequality $X_1 < Y_1$. if the impurity concentration is monotonously changing in the direction of thickness (vertical to the surface), the first definition $X_\square < Y_\square$ and the second definition $X_1 < Y_1$ are entirely equivalent. Here "monotonously" means the mode of change which does not repeat both increasing and decreasing. "Monotonous" decrease means that the mode of change includes only decreasing and keeping constant. "Monotonous" increase means that the mode of change includes only increasing and keeping constant. Practically, the impurity concentration shall be continuously or stepwise, increasing or decreasing in the vapor phase deposition of diamond. Repetition of decrease and increase of impurity concentration shall be forbidden.

However, since the impurity concentration at the surfaces of the diamond plates manufactured by the CVD methods shall be accompanied by fluctuation, the first definition $X_\square < Y_\square$ is not necessarily sufficient. The second definition $X_1 < Y_1$ satisfactorily defines this invention despite fluctuation of impurity concentration, because $X_1$ and $Y_1$ define the impurity concentration in the partial regions with a certain thickness. However, the first definition $X_\square < Y_\square$ may be more convenient for measuring the impurity concentration.

FUNCTIONS

FIG. 1 shows a simple example of a polycrystalline diamond tool. A tool body (1) is made from cemented carbide. A polycrystalline diamond plate (2) is fixed on an end of the tool body (1) by a brazing layer (3). The diamond plate (2) has two surfaces. The outer surface revealed outside is called a rake surface (4). The inner surface concealed by the tool body (1) is here called a fixation surface. In this invention, the impurity concentration is not uniform, but is changing along the direction vertical to the surface, namely along the direction of thickness. The impurity concentration near the fixation surface is higher than that near the rake surface in this invention.

The diamond near the rake surface shall be grown by suppressing the inclusion of impurity as little as possible. On the contrary, the diamond near the fixation surface shall be grown with a material gas including the impurity added intentionally.

The diamond on or near the rake surface shall be synthesized as a diamond of better quality with lower impurity concentration. The diamond on or near the fixation surface shall be synthesized as a diamond of worse quality with higher impurity concentration.

Because of the higher impurity concentration, the diamond in the vicinity of the fixation surface has low rigidity and enough elasticity. This is important. Enough elasticity or low rigidity can alleviate the strong stress applied on the rake surface by an object to be cut. Namely, the diamond on the fixation surface plays a role of a stress alleviation layer or shock absorber layer.

In the structure of the diamond plate, the rigidity is low near the fixation surface but the rake surface has high rigidity. The structure heightens the toughness of the diamond plate as a whole without lowering the rigidity of the rake surface. Because of the high rigidity of the rake surface, the diamond tool has high abrasion resistance. In other words, this invention enables the diamond tool to heighten the chip resistance without damaging the excellent abrasion resistance of diamond.

For defining the invention more strictly, the impurity concentration of the diamond will be now expressed by the three dimensional coordinate. The z-axis is defined as the direction vertical to the surface of the diamond. The x-axis and the y-axis are defined as two vertical directions both of which are parallel to the surface of the diamond. The impurity concentration at the point (x, y, z) is represented by $W(x, y, z)$. The original point of the coordinate exists on the rake surface. Then z=0 means the rake surface. The thickness of the diamond plate is denoted by T. Thus z=T means the fixation surface.

For defining the invention by the impurity concentration, impurity concentration $X_\square$ and $Y_\square$ on the rake surface and on the fixation surface are defined by $$X_\square = \int W(x, y, 0) dx\, dy / S \quad (1)$$

$$Y_\square = \int W(x, y, T) dx\, dy / S \quad (2)$$

$$S = \int dx\, dy \quad (3)$$

where S is the area of the surface of the diamond. The first definition of the invention is expressed by the inequalities.

$$T > 40\ \mu m \quad (4)$$

$$X_\square < Y_\square \quad (5)$$

The reason why a thickness of the diamond plate is more than 40 μm will be now explained. One reason is that the diamond thinner than 40 μm has not enough strength and is likely to be broken. Another reason is that maximum difference of height between the most worn-out spot and the least worn-out spot on the rake surface at the end of life time is more than 40 μm in most cases.

If higher abrasion resistance Is required, the thickness shall preferably be 0.07 mm to 3.0 min. Furthermore, if the production cost caused no serious problems, the diamond plate with the thickness more than 3 mm would be more profitable. Since diamond has the highest heat conductivity, the thicker the diamond plate is, the higher the heat diffusivity rises. The high heat diffusivity prevents the tool edge from being heated too hot.

The most conspicuous feature of this invention is the inequality $X_\square < Y_\square$ or $X_1 < Y_1$. On the contrary, if $X_\square \geq Y_\square$ or $X_1 \geq Y_1$, the fixation surface would not act as a stress alleviation layer or a shock absorber layer and the diamond plate would be likely to be chipped and to be easily worn out.

MEASUREMENTS

Next question is how to measure the impurity concentration in a diamond plate.

Both the rake surface and the fixation surface are suitable for measurement of impurity concentration, because they are exposed out. The impurity state or impurity concentration of diamond layers can be measured by the following methods;
① TEM (Transmission Electron Microscopy)
② TED (Transmission Electron Diffraction)
③ SIMS (Secondary Ion Mass Spectroscopy)
④ XPS (X-ray Photoelectron Spectrometry)
⑤ IMA (Ion Microanalyzer)
⑥ EDX (Energy Dispersive X-ray Spectrometry)
⑦ WDX (Wide Dispersive X-ray Spectrometry)
⑧ EPMX (Electron Probe X-ray Microanalyzer)
⑨ Measurement of Specific Gravity The methods ① and ② enable us to observe the microscopic structure of diamond In addition to measuring the impurity concentration. The information of the microscopic structure around the impurities in diamond is obtainable. The methods ③ to ⑨ make quantitative measurement of impurity concentration possible. These methods can measure only the impurity concentration on the surfaces as such. However, simultaneous spattering of the diamond plate or microcope observation of the section of the diamond plate will bring about the information of impurity concentration at any depth.

As mentioned before, this invention can be defined by the impurity concentration In partial regions with definite thickness in the direction vertical to the surface. Here, the impurity concentration $X_1$ of a rake region can be defined by $$X_1 = \int_0^{0.3T} dz \int W(x,y,z) dx\, dy / U \quad (6)$$

$$U = 0.3TS \quad (7)$$

where T is the total thickness of the diamond layer, and S is the area and U is the volume of the rake region. Namely, $X_1$ is the average impurity concentration of a partial region with a depth of 30% of the total thickness T from the rake surface. The impurity concentration $Y_1$ of a fixation surface region can also be defined by $$Y_1 = \int_{0.7T}^{T} dz \int W(x,y,z) dx\, dy / U \quad (8)$$

$Y_1$ is the average impurity concentration of another partial region with a depth of 30% of the total thickness T from the fixation surface This invention can also be defined by the inequalities, $$X_1 < Y_1$$

$$T > 40\ \mu m$$

However, too much impurity concentration is undesirable for the partial region near the rake surface. Excess impurity concentration would lower the abrasion resistance by impairing the strength of the edge of tools. Therefore, the impurity concentration $X_1$ of the partial rake region with a depth of 30% of the total thickness from the rake surface should be less than 5 percent.

$$X_1 \leq 5\% (\text{atomic }\%) \quad (9)$$

where the ratio of the impurity is defined by atomic percent. The impurity concentration $X_1$ at the rake surface should preferably be very little for the sake of abrasion resistance. Less than 1% is more preferable. Most desirable impurity concentration is less than 1000 ppm (0.1%).

Fabrication of a Diamond Tool

The method for fabricating a diamond plate will be now briefly explained by means of FIG. 2. Since the diamond plate is grown by the chemical vapor deposition methods, an easiest way to change the impurity concentration of diamond along the direction of thickness is changing the density of impurity in material gas continuously or stepwise (either increasing monotonously or decreasing monotonously). Increasing the density of impurity is more preferable than decreasing the density of impurity. The reason will be explained afterward.

Material gas is supplied onto a substrate (6) heated in a CVD apparatus which will be explained in detail later. Being excited by some means, the material gas is dissolved into active radicals or ions and is reacted each other on the substrate. Diamond layer is growing on the substrate, which is shown by FIG. 2(b). The density of impurity in the material gas is changing continuously or stepwise in this invention. After the diamond layer (7) has grown to the predetermined thickness on the substrate (6) by the CVD method, the substrate (6) is etched away by hydrofluoric, nitric acid (mixture of hydrofluoric acid and nitric acid) or aqua regia. Then a diamond plate is obtained (FIG. 2(c)).

Diamond itself has poor wettability with the tool body made from cemented carbide. Then to improve the wettability between the tool body and the diamond plate, one surface of the diamond plate is metalized by evaporation coating of metal (FIG. 2(d)). Then the diamond plate is divided into several chips of diamond with determined size suitable for the tool edge by a YAG laser (FIG. 2(e)). Then the metalized surface is fixed onto the edge surface of the tool (FIG. 2(e)). In those processes, it is also possible to divide the diamond plate earlier than to etch away the substrate.

FIG. 3 shows the sectional view of the tool fitted with the diamond plate. The tool body can be made from any hard metal. But preferably cemented carbide shall be employed as a material of the tool body. The tool edge has the edge surface on which the diamond plate is fixed through the intermediary of the metalized layer. Brazing Is desirable to fix the diamond plate on the edge surface for the sake of high heat resistance and high strength.

Geometric relation For defining this invention is now explained by FIG. 4. The diamond plate has two parallel surfaces. The free surface distanced far from the edge surface of the tool is the rake surface. As mentioned before, a three dimensional coordinate is defined on the diamond plate. The x-axis and y-axis lie on the rake surface. The z-axis is defined along the direction of thickness from the rake surface to the fixation surface. The rake surface is denoted by z=0. The fixation surface is denoted by Z=T, where T is the thickness of the diamond plate. The first dotted line in the vicinity of the rake surface is a plane which is designated by z=0.3 T. The region held by the rake surface and the first dotted plane is the observation region on the side of the rake surface.

The second dotted line in the vicinity of the fixation surface is a plane which is designated by z=0.7 T. The region held by the fixation surface and the second dotted plane is the observation region on the side of the fixation surface.

The impurity concentration $X_1$ and $Y_1$ in these partial observation regions are put into question in this invention.

When a diamond plate is grown by the CVD method, the impurity concentration must be changed according to the teaching of this invention. (Monotonous) increasing of the impurity concentration is better than (monotonous) decreasing of the impurity concentration. The reason will be now explained here.

When diamond is grown on a smooth substrate, the bottom surface in contact with the substrate is very smooth. But the free surface which has been formed near the end of the crystal growth becomes a rugged surface which Is inherent in the CVD-grown polycrystal diamond. This is called hexa-octahedron structure of diamond. If the rugged free surface were assigned to be a rake surface, the ragged pattern of the rake surface would be transcribed on the surface of an object to be cut. To avoid the inconvenience, the rugged free surface which has grown at the end of the growth must be metalized and be fitted to an edge surface of a tool. Thus the smooth bottom surface which has been in contact with the substrate becomes the rake surface of the tool.

Since the fixation surface must include more impurities than the rake surface, the density of impurity in the material gas shall be low at the beginning of the growth, shall monotonously be increased and shall be high at the end of the growth.

Higher impurity concentration near the fixation surface is desirable also for the sake of structural point of view. High impurity concentration near the fixation surface decreases the thermal conductivity there. When the diamond is heated by cutting operation, the lower thermal conductivity near the fixation surface will prevent the diamond plate from being taken off out of the tool end by hidering the heat from conducting to the brazing layer and melting it.

But this order of processes is not indispensable in this invention. The processes can be reversed. The density of impurity in the material gas shall be lowered in this case. The free surface which has been made at the end of the growth shall be ground and shall be assigned to be a rake surface. However, this order of process would increase number of the processes and raise the cost for production. Some fluctuation of impurity concentration during the growth is of course allowable, as far as the impurity concentration ($X_□$) at the rake surface and the impurity concentration ($Y_□$) at the fixation surface satisfy the inequality $X_□ < Y_□$.

Production of Diamond Layer

When diamond is grown by the CVD methods, the material gas includes in general;
① hydrogen gas
② carbon-containing gas . . . methane, ethane, acetylene, ethyl alcohol, methyl alcohol, acetone, etc.

Besides the examples, any material including carbon which can be vaporized may be used as gas ②. Although alcohol and acetone are liquid at room temperature, they are vaporized by heating. Otherwise, they can be vaporized by bubbling them with hydrogen gas. However, hydrogen gas is not indispensable. For example, hydrogen gas can be replaced by water ($H_2O$), hydrogen peroxide ($H_2O_2$), $CF_4$, $C_2F_6$, $C_3F_8$, C—$C_4F_8$, $C_5F_{12}$, $CHF_3$, $CBrF_3$, $CCl_4$, $CCl_3F$, $CCl_2F_2$, $CClF_3$, $SF_5$, $NF_3$, $BCl_3$, $F_2$, $Cl_2$ or $Br_2$ gas. Mixture of these gases are also available for material gas instead of $H_2$.

Besides gas ①and gas ②, rare gases (helium, neon, argon, krypton, xenon and radon) may be mixed into the gases ①and ②. In the case of the CVD methods in which the material gas is activated by plasma, the rare gas increases the density of active elements, e.g. hydrogen radicals or $C_2$, prolongs the life time of the radicals and contributes to grow diamond with uniform quality.

The substrate on which diamond shall be deposited is either W, Me, Ta, Nb, Si, SiC, WC, $W_2C$, $Mo_2C$, TaC, $Si_3N_4$, AlN, Ti, TiC, TiN, B, BN, $B_4C$, diamond, $Al_2O_3$ or $SiO_2$. Furthermore, Cu or Al can be used as a substrate under the special conditions. The substrate is not necessarily a flat plate. This invention can also be applied to the tools having edges with adequate curvature, e.g. a twisted blade or an end mill blade. In this case, the substrate shall be the plate with the curvature as same as that of the tool blade.

This invention dopes impurities by intention to diamond plates. Here, impurities mean in principle all materials except crystalline diamond. Appropriate impurities can be roughly sorted into two groups. First group of impurities contains carbon ingredients except crystalline diamond, e.g. crystalline graphite, amorphous carbon, etc. Second group contains metals, non-metals or their compounds. For example, adequate impurities of the second group are silicon (Si), boron (B), aluminum (Al), tungsten (W), molybdenum (Mo), cobalt (Co), iron (Fe), niobium (Nb), tantalum (Ta). The carbides, oxides and nitrides of them are also available for impurities. The impurities are diffused in a crystalline diamond in the form of a single atom or a single molecule or diffused there in the form of powder with a diameter of 0.5 µm to 2 µm.

The diamond including the first group of impurities (non diamond carbon ingredients) can be made without adding impurities by intention. However, it can also be made by adding powder of graphite by intention.

The diamond including the second group of impurities (non-carbon materials) must be produced by doping impurities by intention. Favorably the impurities shall be doped in the form of halogenides of the impurities. For example, such fluorides, chlorides or bromides, $WF_6$, $WCl_3$, $MoF_6$, $MoCl_3$, $SiF_4$, $Si_2F_6$, $BCl_3$, $ReF_4$, $AlF_3$, $FeCl_3$, $SiCl_4$ are suitable impurities. These impurities are doped into diamond plates as a metal of W,Mo,Si,B or carbides of them, or halogen compounds as they are in the case of insufficient reaction. In any case, high stability against heat or chemicals is obtainable. However, silane gas ($SiH_4$) or diborane gas ($B_2H_6$) can be used for impurities to be doped to the partial fixation region of diamond plates. Furthermore, powdered ceramics are also available for impurities for the diamond.

Powder impurity can be doped into a diamond by dropping the powder intermittently to the growing diamond or by spraying the powder impurity on the material gas flow.

In this invention, the density of impurity shall be continuously or stepwise increased during the crystal growth in the CVD methods. However, it is still difficult to raise the ratio of impurity in the material gas continuously. An easier way is changing the ratio of impurity in two steps or three steps from lower (or zero) ratio to higher ratio. The easiest way is a two step growth comprising a first step In which no impurity is added and a second step in which a certain ratio of impurity is added to the material gas.

For example, in the former step, diamond shall be grown by a material gas containing only hydrogen and methane (methane/hydrogen=about 1% without impurity). In the latter step, diamond is grown by a material gas including a little quantity of halogenide gas, e.g. tungsten fluoride ($WF_6$) or boron chloride ($BCl_3$) in addition to hydrogen gas and methane gas. It is more desirable to increase the portion of methane/hydrogen in the latter step.

The optimum ratio of impurity gas is a little affected by other conditions of growth. For example, if oxygen gas is mixed to the material gas, the ratio of impurity gas or hydrocarbon gas to hydrogen gas can be raised, because a small quantity of oxygen improves the quality of diamond.

Advantages of the Invention

This invention grows the diamond plate with the impurity concentration changing along the direction of thickness by changing the composition of material gas supplied into the CVD apparatus. The diamond tool of tills invention excels in strength, abrasion resistance, chip resistance, adhesion resistance and heat resistance.

The reason why the diamond tool based on this invention is endowed with such properties is now explained. The diamond plates which have been synthesized by the CVD methods so far have uniform property overall without impurity. The diamond of high crystalline quality has very high rigidity. But the diamond is easily broken by an external shock. Namely, a good diamond of high crystalline quality lacks chipping resistance. Thus the tools having a good diamond plate are likely to be broken in a short time when they are used to cut or shave something. Perfect lattice structure of the diamond without impurity heightens the rigidity. Because of the high rigidity, the perfect diamond is likely to be chipped. High chipping resistance does not consist with high rigidity.

Is the diamond with high impurity concentration more suitable for tools than the diamond without impurity? The diamond with high impurity concentration excels in toughness or chipping resistance, because of the proper elasticity. But they are inferior to the diamond without impurity in strength, abrasion resistance, because of the low rigidity.

A good tool requires both chipping resistance and abrasion resistance. Determining the impurity concentration within some range in the diamond plate does not give us a diamond tool with the most suitable properties. The surface which will contact with the objects to be cut requires high abrasion resistance. However, the toughness should be heightened to increase the chipping resistance. Toughness and rigidity are reciprocal properties. It is very difficult to heighten both the toughness and the rigidity of the same object.

Therefore, this invention gives complementary properties to the diamond plate along the direction of thickness. The rake surface which will come in contact with the objects is made from better diamond with lower impurity concentration. Thus, the rake surface has high abrasion resistance. The fixation surface which is fixed on the tool is made from worse diamond with higher impurity concentration. Thus, the fixation surface is rich in elasticity and toughness.

When an external shock is applied on the rake surface, the more elastic diamond near the fixation surface will alleviate and absorb the shock by shrinking. The elasticity of the diamond near the fixation surface endows the diamond tool with high quality.

The abrasion resistance of a tool depends on the rake surface. In this invention, the diamond on the rake surface has a highly ordered crystalline structure with high rigidity. Thus, the diamond tool reveals enough abrasion resistance even against the object difficult to cut or shave. For the sake of the life time as a tool, it Is desirable that the region held between the rake surface and the plane distanced from the rake surface by 30% of thickness is made from the diamond of high quality. Here the high quality means low impurity concentration. The impurity concentration must be less than 5 at %. Favorably it shall be less than 1 at %. The optimum impurity concentration is less than 1000 ppm (0.1%).

In the case of sintered diamond, the abrasion resistance is restricted by the binder. And adhesion resistance is also suppressed by the binder. Unlike the sintered diamond, the CVD grown diamond is inherently rich in abrasion resistance and adhesion resistance, because it includes no binder.

The diamond tool of tiffs invention is suitable for the tools which require high abrasion resistance, high chip resistance, high strength and high adhesion resistance, e.g. the tools for cutting, tools for grinding tools For digging or dressers.

DETAILED DESCRIPTION OF THE EMBODIMENTS

This invention can be applied to all the CVD methods which are able to synthesize diamond. The inventors have applied it to the following CVD methods;
① filament CVD method (FIG. 5)
② microwave plasma CVD method (FIG. 6)
③ heat-exciting CVD method (FIG. 7)
④ heat plasma CVD method (FIG. 8)

Common substrates are used for all the embodiments. The substrate is a polycrystal silicon plate of 14 mm×14 mm×2.5 mm. One surface has been lapped with the abrasive containing granules of 0.5 µm to 5 µm in diameter until the maximum roughness $R_{MAX}$ became less than 0.8 µm ($R_{MAX}$<0.8 µm) and the flatness became less than 1 µm. The apparatuses for the CVD methods are explained. Then the results this invention has brought about on the apparatus will be described.

EMBODIMENT ①

Filament CVD Method

Figure 5:
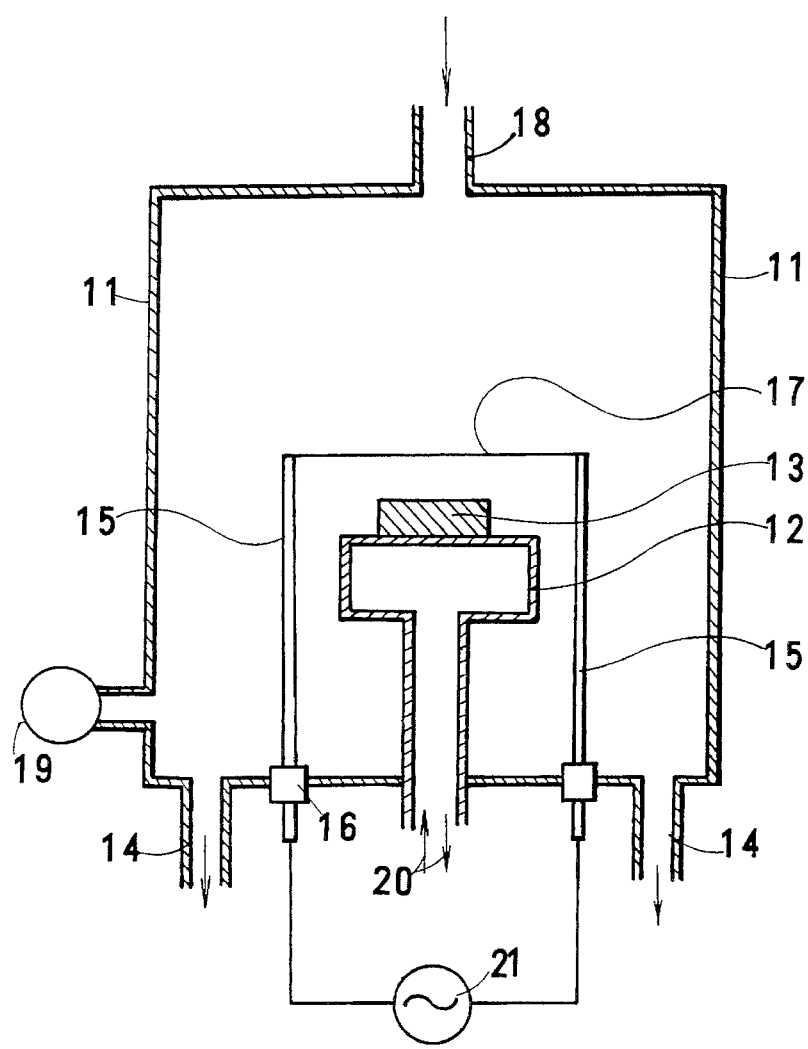
FIG. 5 is a schematic sectional view of a filament CVD apparatus.

FIG. 5 shows a filament CVD apparatus. In a vacuum chamber (11), a susceptor (12) is installed. A substrate (13) is mounted on the susceptor (12). The vacuum chamber (11) has an exhaust outlet (14) which is connected to a vacuum pump (not shown in the figures). Electrodes (15) are stood in the vacuum chamber (11). The electrodes (15) penetrate insulators (16) and are connected to a filament power source (21). Filaments (17) span the electrodes (15). Material gas is supplied into the vacuum chamber (11) through a gas inlet (18). A vacuum gauge (19) measures the degree of vacuum in the vacuum chamber (11). Cooling water (20) is introduced into the inner space of the susceptor (12) for cooling it.

Three kinds of filaments made from different materials had been prepared. One was 4N-W (tungsten of 99.99% in purity), the other was 4N-Ta (tantalum of 99.99% in purity) and the third was 4N-Re (rhenium of 99.99% in purity). The diameter of all the filaments was 0.2 mm. Plural filaments were mounted in parallel with a distance of 4 mm. The distance between the filaments (17) and the substrate (13) was 5 mm. The temperature of the filaments (17) was measured by an optical thermometer. The temperature of substrate (13) was monitored by a Chromel-Alumel thermocouple which was welded to a surface of a molybdenum plate with the same size as the substrate, being laid near the substrate (13) on the susceptor (12).

By the filament CVD apparatus, diamond plates were grown on the silicon substrate under various conditions with different components of material gas, different growing time, different pressure or different temperature of growth, according to this invention and the conventional method (uniform quantity in the whole). Table 1 shows the result. The temperature of the filaments was changed from 1500° C. to 2400° C. The temperature of the substrate was changed from 80° C. to 950° C.

TABLE 1

CONDITIONS FOR SYNTHESIZING DIAMOND BY FILAMENT CVD METHOD

| | sample | steps | material gas (SCCM) | time (H) | Pressure (Torr) | substrate temperature (°C.) | filament material | filament temperature (°C.) |
|---|---|---|---|---|---|---|---|---|
| embodi- ments | A | 1 | $H_2$ 600 $CH_4$ 5.0 | 50 | 80 | 950 | W | 2150 |
| | | 2 | $H_2$ 600 $CH_4$ 12.0 $WF_6$ 2.0 | 20 | 80 | 250 | W | 1800 |
| | B | 1 | $H_2$ 600 $CH_4$ 2.0 | 60 | 130 | 940 | Ta | 2400 |
| | | 2 | $H_2$ 100 $CH_4$ 4.25 $BCl_3$ 2.5 | 15 | 130 | 800 | W | 2100 |
| | C | 1 | $H_2$ 600 $CH_4$ 12 $H_2O$ 2 $F_2$ 0.1 | 7 | 50 | 700 | W | 2150 |
| | | 2 | $H_2$ 600 $CH_4$ 6 $F_2$ 0.1 | 13 | 80 | 500 | Re | 2080 |
| | | 3 | $H_2$ 600 $CH_4$ 10 $F_2$ 0.3 | 45 | 40 | 650 | Ta | 2350 |
| | | 4 | $H_2$ 600 $CH_4$ 30 $SiCl_4$ 3.0 $F_2$ 0.3 | 10 | 120 | 400 | W | 1900 |
| | D | 1 | $H_2$ 600 $CH_4$ 2.5 | 100 | 60 | 900 | W | 2150 |
| | | 2 | $H_2$ 600 $CH_3Br$ 10 $N_2$ 1 $FeCl_3$ 1.5 | 15 | 80 | 300 | W | 1500 |

TABLE 1-continued

CONDITIONS FOR SYNTHESIZING DIAMOND BY FILAMENT CVD METHOD

|  | sample | steps | material gas (SCCM) | time (H) | Pressure (Torr) | substrate temperature (°C.) | filament material | filament temperature (°C.) |
|---|---|---|---|---|---|---|---|---|
| compari- son ex- amples | E | 1 | $H_2$ 600 $CH_4$ 15 | 30 | 80 | 940 | Ta | 2400 |
|  | F | 1 | $H_2$ 600 $CH_4$ 2 | 170 | 80 | 910 | W | 2200 |
|  | G | 1 | $H_2$ 600 $C_2H_5OH$ 5 $B_2H_6$ 2 | 155 | 50 | 870 | Re | 2100 |
|  | H | 1 | $H_2$ 600 $CH_4$ 20 $WF_6$ 1.8 | 20 | 120 | 900 | W | 2150 |
|  |  | 2 | $H_2$ 600 $CH_4$ 5 | 55 | 60 | 850 | W | 2150 |

Here A to H are symbols of samples. Samples A to D are embodiments of this invention and samples E to H are comparison examples based on the conventional method in Table 1.

In the embodiments A to D and the comparison example H, the components of material gas or the ratio of the components were changed with time. For example, in the embodiment A, the substrate was coated in the material gas flow comprising 600 sccm of hydrogen gas ($H_2$) and 5 sccm of methane gas ($CH_4$) under 80 Torr by heating with the tungsten filament at 2150° C. for 50 hours at the first step. Then the substrate was coated in the material gas flow comprising 600 sccm of hydrogen gas ($H_2$) and 12.0 sccm of methane gas ($CH_4$) and 2.0 sccm of tungsten fluoride gas ($WF_6$) under 80 Torr by heating with the tungsten filament at 1800° C. for 20 hours at the second step. Here "sccm" is a simplified expression of a unit of gas flow "standard cubic centimeter". 1 sccm means that 1 $cm^3$ of gas reduced in the standard state i.e. at 0° C. under 1 atmosphere flows per minute. The embodiment A changed the component and the component ratio of the material gas in two steps. Other two embodiments B and D changed the component and component ratio of the material gas in two steps. The embodiment C changed the components or component ratio of the material gas in four steps.

The comparison example E synthesized diamond with the material gas with high density of carbon in a single step. The comparison example F synthesized diamond with the material gas with low density of carbon in a single, step also. The comparison example H changed the impurity ratio of the material gas in two steps in contradiction to this invention.

In every sample, diamond grew on the substrate. Then the silicon substrate was dissolved by a pertinent etchant. Square diamond plates were obtained. Each diamond plate was metalized and cut along the diagonal lines into four isosceles right-angled triangles.

Figure 1:
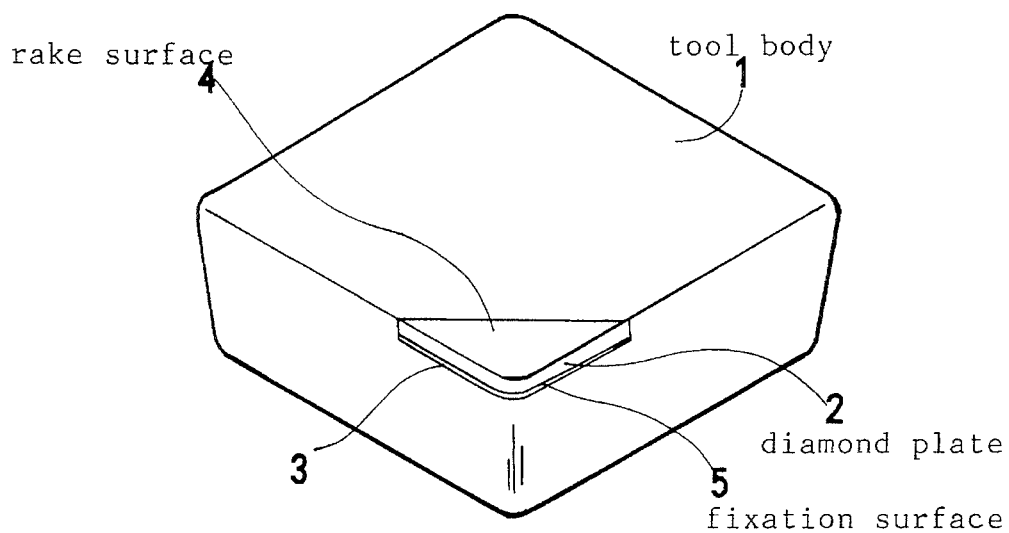
FIG. 1 is a simplified perspective view of a polycrystalline diamond tool.
Figure 3:
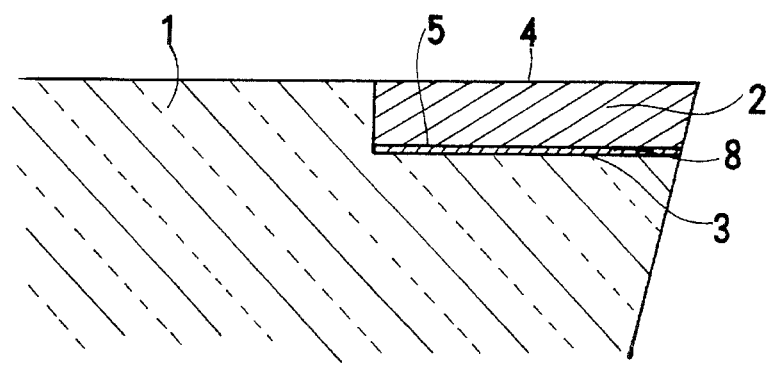
FIG. 3 is a sectional view of an edge of the diamond tool.
Figure 4:
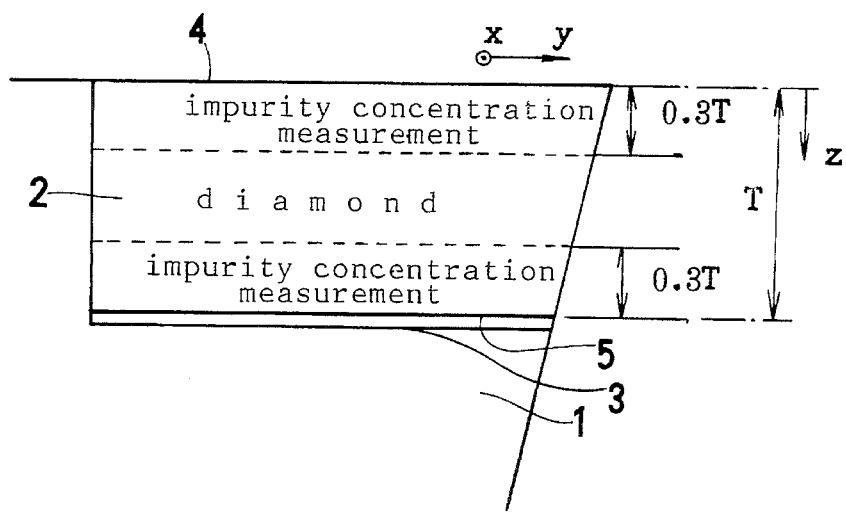
FIG. 4 is a sectional view of the diamond plate for showing the points for the impurity concentration measurement.
Figure 2:
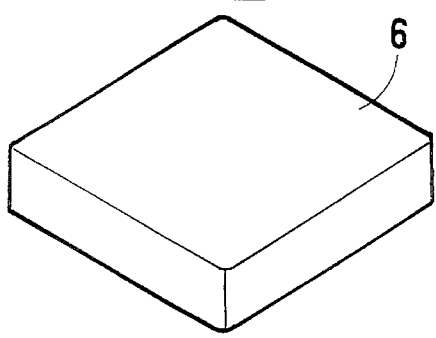
FIGS. 2(a)–2(f) are perspective views showing the steps for producing the polycrystalline diamond tool.
Figure 2:
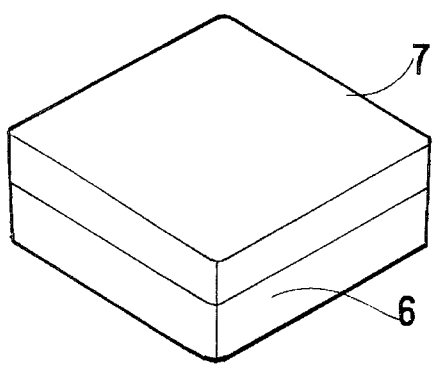
Figure 2:
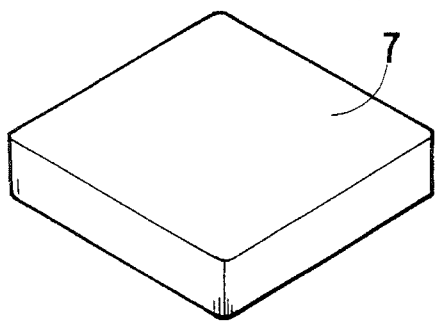
Figure 2:
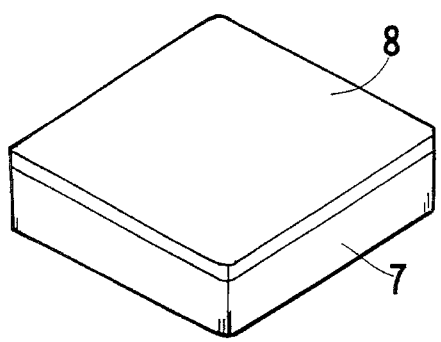
Figure 2:
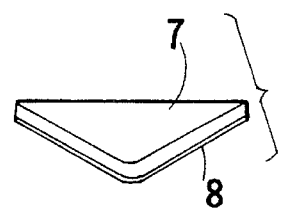
Figure 2:
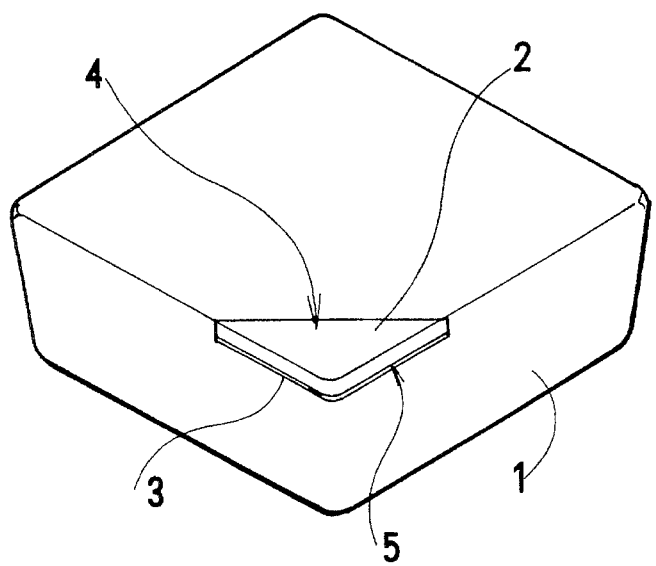

These diamond plates were mounted and brazed on the tools made of cemented carbide according to the processes shown in FIG. 2. The free surfaces which had grown at the end of the growth were directly fixed to the tools. The surfaces which had grown at the beginning of the growth and were in contact with the substrate were assigned to be rake surfaces. The sample tools A to H were estimated by examining the impurity concentration of diamond. Table 2 shows the results of the measurement. In table 2, sample names, partial layers, thicknesses of the partial layers, total thickness, observation points, impurity elements and impurity concentration are listed. The observation points are denoted by the distance from the rake surface as shown in FIG. 4. The first layer is a layer nearer to the rake surface and the second layer is a layer nearer to the fixation surface in the samples A, B, D and H. The measurements of the impurity concentration were done by the SIMS (Secondary Ion Mass Spectroscopy) or IMA (Ion Microanalyzer).

TABLE 2

IMPURITY CONCENTRATION MEASUREMENT OF THE SAMPLES

|  | sample | layer | thickness of layers (μm) | total thickness (μm) | observation point (μm) | impurity concentration (%) |
|---|---|---|---|---|---|---|
| EMBODI- MENTS | A | 1 | 50 | 100 | 8 | undetectable |
|  |  | 2 | 50 |  | 95 | W 1.5 F 0.05 |
|  | B | 1 | 50 | 120 | 5 | undetectable |
|  |  | 2 | 70 |  | 111 | B 2 Cl 0.08 |
|  | C | 1 | 5 | 100 | 7 | F 0.05 |
|  |  | 2 | 15 |  | 18 | F 0.04 |
|  |  | 3 | 50 |  | 65 | F 0.1 |
|  |  | 4 | 30 |  | 94 | Si 3.5 Cl 0.12 F 0.11 |
|  | D | 1 | 86 | 150 | 10 | undetectable |
|  |  | 2 | 64 |  | 140 | Br 0.8 F 2.8 N 0.05 Cl 0.8 |
| COMPAR- ISON EXAM- PLES | E | 1 | 120 | 120 | 10 | undetectable |
|  |  | 2 |  |  | 110 | undetectable |
|  | F | 1 | 100 | 100 | 10 | undetectable |
|  |  | 2 |  |  | 90 | undetectable |
|  | G | 1 | 130 | 130 | 10 | B 1.5 Si 0.02 |
|  |  | 2 |  |  | 120 | B 1.2 Si 0.01 |
|  | H | 1 | 45 | 95 | 12 | W 1.6 F 0.04 |
|  |  | 2 | 50 |  | 90 | undetectable |
|  | I | 1 | 120 | 120 | 10 | undetectable |
|  |  | 2 |  |  | 110 | undetectable |

TABLE 2-continued

IMPURITY CONCENTRATION MEASUREMENT OF THE SAMPLES

| sample | layer | thickness of layers μm | (μm) total thickness | (μm) observation point | impurity concentration (%) |
|---|---|---|---|---|---|
| J | 1 | 150 | 150 | 10 | Co 10.0 |
|   | 2 |     |     | 140 | Co 11.2 |

"undetectable" means that the impurity concentration is less than 3 ppm in the carbon matrix.

The samples A to D are embodiments of this invention. The sample E to G are comparison examples which have no partial layers, because the material gas had not been changed stepwise as shown in Table 1. The sample I is a natural diamond II a fixed on a tool as a comparison sample for the impurity concentration measurement.

The sample J is another comparison sample. This is a sintered diamond which was made by sintering the diamond polycrystalline powder of 10 μm in average diameter including cobalt (Co) of 10 volume % under high pressure. The sample J was not made by the CVD methods. Since the sample J is a cutting chip with a sintered diamond fitted to the tool, it includes high density of Co (10%) nearly uniformly.

The observation points are defined by the distance z (μm) from the rake surface as shown in FIG. 4. The layers 1 and 2 are the partial layers caused by changing the components or component ratio in the material gas. Since the side which had deposited at the beginning of the growth was assigned to be a rake surface, the steps 1 and 2 in Table 1 correspond to the layers 1 and 2 respectively. As a matter of course, impurity concentration is smaller near the rake surface in the embodiments.

The comparison example H changed the impurity concentration of diamond in the material gas stepwise in contradiction to the teaching of this invention in the CVD growth. The grown diamond has also the contradictory distribution to this invention regarding the impurity concentration.

All the embodiments A to D increased the ratio of impurity in the material gas. In accordance with the treatment, in the grown diamond plate, the impurity concentration increases along the direction of growth i.e. the direction from the rake surface to the fixation surface.

Performance test was done for the diamond tools under the conditions. The object to be cut is a round bar with four axial grooves made from A 390 alloy (Al—17% Si).

speed for cutting: 800 m/min depth of cutting: 0.2 mm feed: 0.1 ram/rev.

Since abrasion loss Is an Important parameter for the performance test, average abrasion losses in 90 minute cutting or in 30 minute cutting were measured. Table 3 shows the results of the performance test.

TABLE 3

CUTTING PERFORMANCE OF THE DIAMOND SYNTHESIZED BY FILAMENT CVD METHOD

| | SAMPLE | $V_b$ ABRASION LOSS (μm) | |
|---|---|---|---|
| EMBODI MENTS | A | average abrasion loss in 90 minute cutting | 12 μm |
|  | B | average abrasion loss in 90 minute cutting | 18 μm |
|  | C | average abrasion loss in | 17 μm |

TABLE 3-continued

CUTTING PERFORMANCE OF THE DIAMOND SYNTHESIZED BY FILAMENT CVD METHOD

| | SAMPLE | $V_b$ ABRASION LOSS (μm) | |
|---|---|---|---|
|  | D | 90 minute cutting average abrasion loss in 90 minute cutting | 20 μm |
| COM PARISON EXAM PLES | E | average abrasion loss in 30 second cutting | 100 μm |
|  | F | 45 second cutting, breakdown by chipping | |
|  | G | 1 minute cutting, breakdown by chipping | |
|  | H | average abrasion loss in 45 second cutting | 98 μm |
|  | I | 45 second cutting, breakdown by chipping | |
|  | J | average abrasion loss in 20 minute cutting | 95 μm |

From Table 2 and Table 3, all embodiments A to D exhibit high cutting performance without breakdown in the A390 cutting test. They all have the diamond in which the impurity concentration near the rake surface is smaller than the impurity concentration near the fixation surface.

On the contrary, the comparison examples F, G and I, in which inequality $X_1<Y_1$ does not hold, were broken down or worn out seriously in a short time.

Another comparison example J, i.e. sintered diamond, was not broken down. But the average abrasion loss in 90 minute cutting was 95 μm, which is far larger than that of the embodiments. Since the sintered sample J contains the binder, e.g. cobalt (Co), the binder would lower the abrasion resistance.

The comparison examples F and I, which has undetectably little impurity concentration lack toughness and chipping resistance.

As mentioned many times, the diamond plate of this invention has lower impurity concentration near the rake surface and high impurity concentration near the fixation surface. Non-uniformity of impurity concentration is the essential feature of this invention. The diamond near the fixation surface with adequate elasticity alleviates the strong force acting on the rake surface and heightens the chipping resistance overall.

Samples A to D, embodiments of this invention have high abrasion resistance. Namely, 90 minutes abrasion loss is little. They are immune from breakdown by chipping. The samples A to D have the distribution of impurity concentration defined by the inequality $X_1<Y_1$ or $X_\square<Y_\square$ which has been formed by changing the ratio of Impurity in material gas in the growth of the vapor phase deposition methods. $X_\square$ is an impurity concentration on the rake surface of a diamond plate. $Y_\square$ is an impurity concentration on the fixation surface of the diamond plate. $X_1$ is an average impurity concentration of the rake partial region within a depth of 30% of the total thickness from the rake surface. $Y_1$ is an average impurity concentration of the fixation partial region within a depth of 30% of the total thickness from the fixation surface. Of course, $X_1$ or $Y_1$ can otherwise be defined as an average impurity concentration of the partial regions within a depth of 20% or 40% of the total thickness.

Halogen elements or Halogenide compounds are suitable for impurities to be doped into the region near the fixation surface. Introduction of these gases are facile enough. Excess impurity concentration is forbidden. The impurity concentration must be less than 5% at the rake surface. More than 5% of impurity concentration at the rake surface would deteriorate abrasion resistance devastatingly. On the contrary the impurity concentration near the rake surface is preferably less than 1000 ppm. Lower impurity concentration will heighten the abrasion resistance at the rake surface.

The thickness of the diamond plate must be more than 40 μm. One reason is that such a diamond plate thinner than 40 μm would be likely to be broken owing to the lack of strength. Another reason is that the difference of height between the most worn out spots and the least worn out spots is often more than 40 μm at the end of the life time of the tools.

If still more abrasion resistance is required, such a diamond plate with a thickness of 0.07 mm to 3.0 mm is preferable. A thick blade suppresses the rising of the temperature of blade by heightening the heat diffusivity. Thus the abrasion resistance is raised.

right angles to the quartz cylinder. However, other geometric relations between the waveguide and the quartz cylinder can be chosen as long as high density plasma is induced by the microwave oscillation. The shape and the size of the waveguide determine the mode of microwave. A plunger (32) carrying a reflector can be displaced in the waveguide (30). Since the frequency of the microwave is predetermined (e.g. 2.45 GHz), the mode of the standing wave is uniquely determined by the position of the plunger. The microwave CVD apparatus belongs to state of arts.

Like embodiment ①  the material gas comprises carbon containing gas, hydrogen gas and impurity gas. Preferably magnets are furnished around the quartz cylinder for generating the cusp magnetic field or the axial magnetic field for confining the plasma within a small space near the substrate.

Table 4 shows the conditions for synthesizing diamond by the microwave plasma CVD method. The substrates were polycrystalline silicon plates of 14 mm×14 mm×2.5 min. The silicon plates had lapped by abrasive granules with diameters of 0.5 μm to 5 μm till the roughness became less than 0.8 μm ($R_{max}$<0.8 μm) and the flatness became less than 1 μm (flatness<1 μm). The temperature of the substrate was monitored by the optical thermometer during the deposition. The temperature data were calibrated by the data obtained by measuring them by a thermocrayon. The substrates were heated to a temperature between 400° C. and 950° C.

TABLE 4

CONDITIONS FOR SYNTHESIZING DIAMOND BY MICROWAVE PLASMA CVD METHOD

|  |  |  | material gas (sccm) | TIME (H) | pressure (Torr) | substrate temperature (°C.) |
|---|---|---|---|---|---|---|
| embodiments | K | 1 | $H_2$ 200 Ar 100 $CH_4$ 4.5 $H_2O$ 2.5 | 30 | 120 | 950 |
|  |  | 2 | $H_2$ 200 Ar 100 $CH_4$ 8 $WF_6$ 1.0 | 25 | 80 | 800 |
|  | L | 1 | $H_2$ 200 Ar 100 $CH_4$ 2.0 | 38 | 100 | 880 |
|  |  | 2 | $H_2$ 200 Ar 100 $CH_4$ 10 $BCl_3$ 1.8 | 20 | 110 | 800 |
|  | M | 1 | $H_2$ 400 Ar 100 $CH_4$ 8 $H_2O$ 4 $F_2$ 0.01 | 5 | 80 | 600 |
|  |  | 2 | $H_2$ 200 $CH_4$ 6 $F_2$ 0.1 | 12 | 40 | 555 |
|  |  | 3 | $H_2$ 200 $CH_4$ 10 $F_2$ 0.3 | 8 | 50 | 400 |
|  |  | 4 | $H_2$ 200 Ar 100 $N_2$ 2 $CH_4$ 9 $F_2$ 0.3 | 25 | 100 | 300 |
|  | N | 1 | $H_2$ 200 $CH_4$ 2 | 100 | 40 | 700 |
|  |  | 2 | $H_2$ 200 $CH_3Br$ 6 $FeCl_3$ 1.2 | 80 | 40 | 400 |
| comparison examples | O | 1 | $H_2$ 200 $CH_4$ 2 | 250 | 40 | 880 |
|  | P | 1 | $H_2$ 200 $CH_4$ 10 | 180 | 55 | 920 |
|  | Q | 1 | $H_2$ 200 $CH_4$ 8 $F_2$ 0.1 | 85 | 45 | 950 |
|  |  | 2 | $H_2$ 200 $CH_4$ 4 $H_2O$ 0.5 | 200 | 30 | 880 |

EMBODIMENT ②

Microwave Plasma CVD Method

Figure 6:
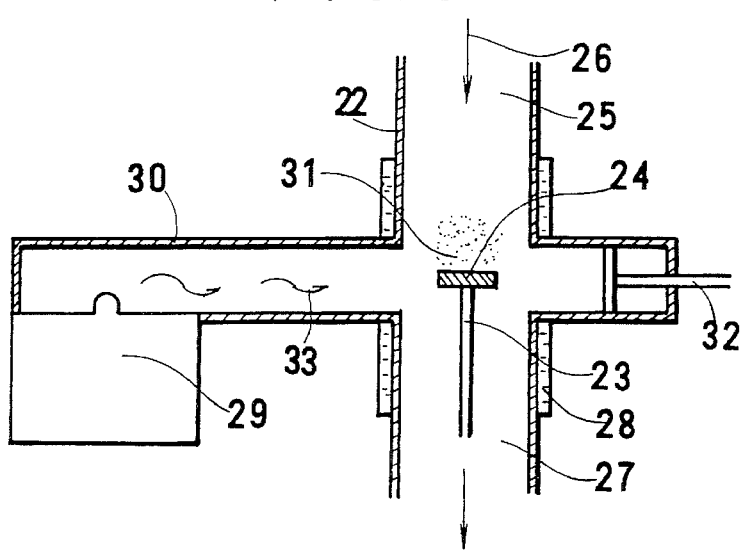
FIG. 6 is a schematic sectional view of a microwave plasma CVD apparatus.

Second, this invention was applied to the microwave plasma CVD method. FIG. 6 shows the apparatus. In a quartz cylinder (22), a quartz bar (23) supports a substrate (24) on its top end. From a gas inlet (25) above, material gas (26) is introduced into the quartz cylinder (22). Exhaust gas is exhaled from a gas outlet (27) below. A cooling water jacket (28) is equipped around the reaction region of the quartz cylinder (22). A magnetron (29) generates microwave (33). The microwave (33) propagates through a waveguide (30) to the vicinity of the substrate (24). The microwave excites the material gas to plasma or neutral radicals. High density of plasma (31) is generated around the substrate (24). In this embodiment, the waveguide is at right angles to the quartz cylinder (22) and the microwave propagates at Samples K to N are embodiments of this invention. These embodiments changed the components or the component ratio of material gas in two steps or four steps to increase the impurity concentration in later steps. $WF_6$, $BCl_3$, $F_2$ or $FeCl_3$ were doped as an impurity like embodiment ①. Rare gas, e.g. Ar was added to excite the microwave plasma stably and to increase the density of active radicals, e.g. Hα and $C_2$.

Samples O to Q are comparison examples. The samples O and P were synthesized overall by the material gas without impurity. The sample Q changed the component ratio of impurity in the material gas in contradiction to this invention.

Like embodiment ①, the diamond plates were cut into four triangles. Cutting chips were made by fitting the diamond plates on tools. The measurements of the impurity concentration were done on the tools. Table 5 shows the results of the measurements.

TABLE 5

IMPURITY CONCENTRATION MEASUREMENT OF THE DIAMOND SYNTHESIZED BY MICROWAVE PLASMA CVD METHOD

| sample | | layer | thickness of layers μm | (μm) total thickness | (μm) observation point | impurity (%) concentration |
|---|---|---|---|---|---|---|
| embodiments | K | 1 | 60 | 120 | 7 | undetectable |
| | | 2 | 60 | | 115 | W 2.0 F 0.1 |
| | L | 1 | 40 | 90 | 5 | undetectable |
| | | 2 | 50 | | 84 | B 2.2 Cl 1.2 |
| | M | 1 | 15 | 107 | 7 | F 0.01 |
| | | 2 | 10 | | 20 | F 0.1 |
| | | 3 | 12 | | 30 | F 0.22 |
| | | 4 | 70 | | 100 | F 0.35 N 0.8 |
| | N | 1 | 78 | 168 | 10 | undetectable |
| | | 2 | 90 | | 150 | B 1.2 F 2.5 Cl 0.8 |
| comparison examples | O | 1 | 120 | 120 | 10 | undetectable |
| | | 2 | | | 110 | undetectable |
| | P | 1 | 100 | 100 | 10 | undetectable |
| | | 2 | | | 90 | undetectable |
| | Q | 1 | 130 | 130 | 10 | F 0.12 |
| | | 2 | | | 120 | F 0.01 |

Here the observation points are designated by the depth z (μm) from the rake surface. The fixation surface was grown at the beginning of deposition. The rake surface was grown at the end. Therefore, the steps of Table 4 correspond to the layers of Table 5.

Under the same conditions as the embodiment ①, the diamond tools were estimated by the cutting performance test. The Lest object to be cut was a round bar of alloy A390 (Al—17% Si) with four axial grooves on the outer surface. The conditions of dry cutting were;

speed for cutting: 800 m/min depth for cutting: 0.2 mm feed: 0.1 mm/rev.

Table 6 shows the results of the cutting performance test.

TABLE 6

CUTTING PERFORMANCE OF THE DIAMOND SYNTHESIZED BY MICROWAVE PLASMA CVD METHOD

| | SAMPLE | $V_b$ ABRASION LOSS (μm) | |
|---|---|---|---|
| EMBODIMENTS | K | average abrasion loss in 90 minute cutting | 19 μm |
| | L | average abrasion loss in 90 minute cutting | 16 μm |
| | M | average abrasion loss in 90 minute cutting | 22 μm |
| | N | average abrasion loss in 90 minute cutting | 17 μm |
| COMPARISON EX SAMPLES | O | 30 second cutting, breakdown by chipping | |
| | P | average abrasion loss in 50 second cutting | 150 μm |
| | Q | 1 minute cutting, breakdown by chipping | |

From Table 5 and Table 6, all embodiments K to N exhibited high cutting performance without breakdown in the A390 cutting test. They all have the diamond in which the impurity concentration near the rake surface is lower than the impurity concentration near the fixation surface ($X_\square < Y_\square$).

The average abrasion loss in 90 minute cutting of the diamond tools of this invention was very little (10 μm to 20 μm). Therefore, the diamond tools are suitable for practical use.

On the contrary, the comparison examples O and P, in which no impurity (except carbon ingredients) was detected, were broken down or worn out seriously in a short time. The specific gravity of the sample P is 2.7 g/cm³ at the partial region from the rake surface to a depth of 10 μm, and is 2.7 g/cm³ too at the partial region from a depth of 90 μm to a depth of 100 μm. Since it is less than the specific gravity of pure diamond, the sample P must include some carbon ingredients except diamond. The sample P includes tantamount carbon ingredients uniformly both in the rake surface region and in the fixation surface region. Therefore it must lack abrasion resistance entirely, although the carbon ingredients raises the chipping resistance. From the measurement of specific gravity, the sample P is assumed to contain nearly 36 wt % of carbon ingredients except diamond. The comparison example Q with the impurity distribution in contradiction to this invention was broken down owing to the lack of toughness.

EMBODIMENT ③

Heat-exiting CVD

Another polycrystalline diamond plates were fabricated by the heat-exciting CVD method.

Figure 7:
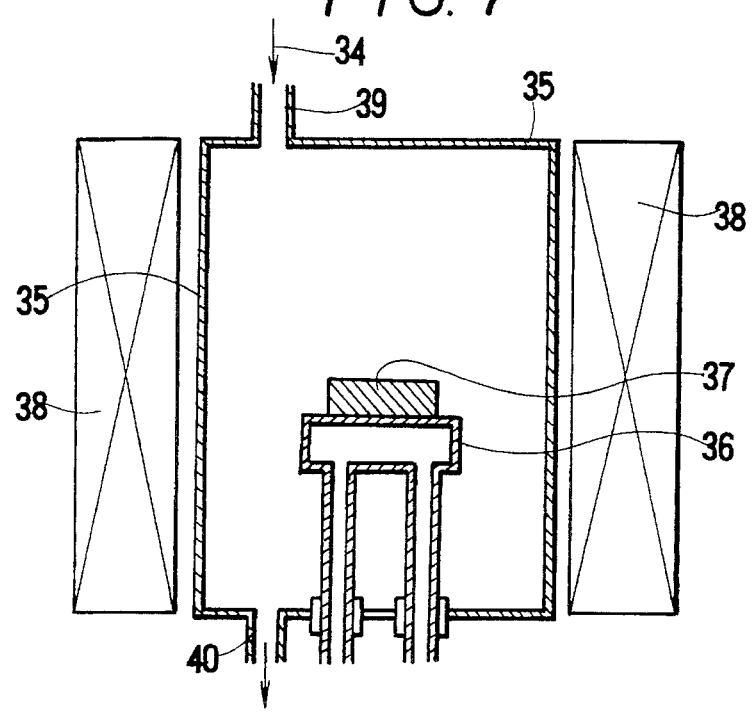
FIG. 7 is a schematic sectional view of a heat-exciting CVD apparatus.
Figure 8:
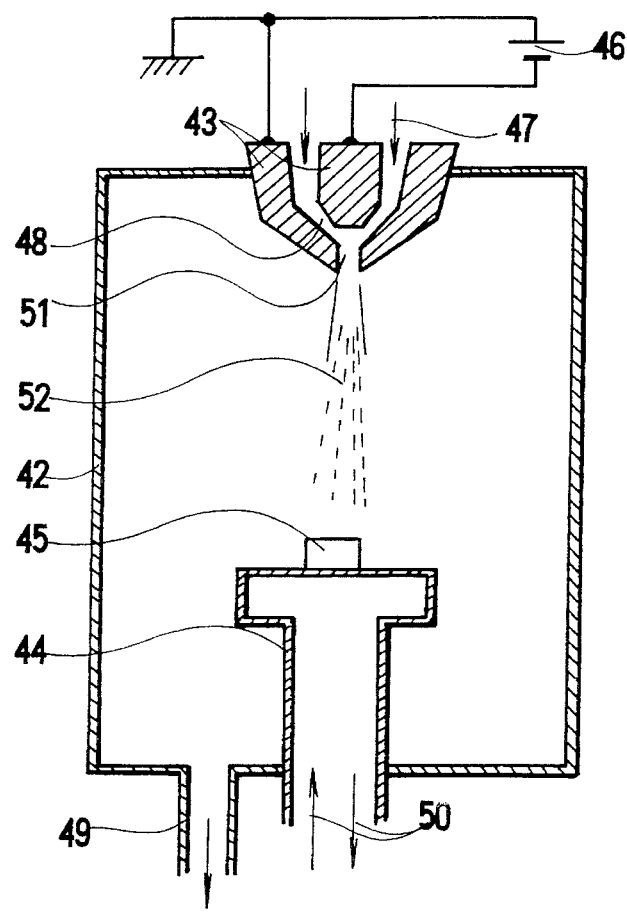
FIG. 8 is a schematic sectional view of a heat plasma CVD apparatus.

FIG. 7 shows the heat-exciting CVD apparatus. A quartz chamber (35) is a chamber which can be made vacuous. A susceptor (36) stands in the quartz chamber (35). A substrate (37) is mounted on the susceptor (36). A heater (38) is furnished around the quartz chamber (35). Material gas is inhaled through a gas inlet (39) into the quartz chamber (35). Exhaust gas is exhaled through a gas outlet (40). Since the material gas is excited by heat, polycrystalline diamond is deposited on the substrate, being synthesized by the vapor phase chemical reaction.

The substrate is a polycrystalline silicon plate of 14 mm×14 mm×2.5 min. The ratio of impurity gas in the material gas was changed in two steps. The conditions for synthesis for each step were;

| (First step) conditions . . . heat-exiting CVD method | | |
|---|---|---|
| material gas | $H_2$: | 1000 sccm |
| | $CH_4$: | 20 sccm |
| | $F_2$: | 2 sccm |

-continued

| | He: | 50 sccm |
|---|---|---|
| pressure: | | 100 Torr |
| substrate temperature: | | 100° C. |
| thickness: | | 80 μm |

(Second step) conditions (following 1st step) . . . heat-exciting CVD method

| material gas | H$_2$: | 1000 sccm |
|---|---|---|
| | CH$_3$Br: | 18 sccm |
| | F$_2$: | 18 sccm |
| | He: | 150 sccm |
| | WF$_6$: | 2.5 sccm |
| pressure: | | 100 Torr |
| substrate temperature: | | 100° C. |
| thickness: | | 100 μm |

By the first step (heat-exciting CVD) and the second step (heat-exciting CVD) of the deposition, a diamond layer of 180 μm in thickness was obtained. A tool was made by brazing the metalized and divided diamond plate on a cemented carbide tool body according to the processes shown in FIG. 2.

The impurity concentration measurement was carried out to the diamond plate. The impurity concentration for the first and the second layers were, first layer . . . (at the point distanced by 10 μm from the rake surface)
0.02% second layer . . . (at the point distanced by 165 μm from the rake surface)
W . . . 1.6%
Br . . . 0.1%
F . . . 0.12%;

The impurity concentration was higher in the second layer made by the material gas with higher density of impurities.

To estimate the cutting performance, a round bar of A390 alloy ( Al—17% Si) with four axial grooves was cut by this diamond tool under the same conditions as the embodiments ① and ②, speed for cutting: 800 mm/min
depth of cutting: 0.2 mm
feed: 0.1 mm/rev.

The $V_b$ abrasion loss in 120 minute cutting was 15 μm. This result shows that this invention is also applicable to the heat-exciting CVD method.

EMBODIMENT ④

Heat Plasma CVD Method

FIG. 8 shows the heat plasma CVD apparatus. On an upper wall of a vacuum chamber (42), coaxial electrodes (43) are equipped. A susceptor (44) is installed below the electrodes (43). A substrate (45) is mounted on the susceptor (44). The inner electrode is a cathode and the outer electrode is an anode. Some voltage is applied between the anode and the cathode by the direct current power source (46).

Passing through the gap between the anode and the cathode, material gas (47) is inhaled into the vacuum chamber (42) via a nozzle (51). Being ionized to plasma gas by the action of discharge between the electrodes (43), the ionized material gas (47) flows toward the substrate (45). The ionized material gas reacts in vapor phase. The synthetic is deposited on the substrate. Exhaust gas is exhaled from the gas outlet (49) to a vacuum pump (not shown in the figures).

The substrate is a silicon polycrystal plate of 14 mm×14 mm×2.5 mm like the embodiment ③. In order to change the impurity concentration of diamond along the direction of thickness, the diamond was grown in two steps.

(first step) conditions for growth . . . heat plasma CVD
material gas
H$_2$: 10 slm
CH$_4$: 1.5 slm
Fe: 0.05 slm
Ar: 30 slm
pressure: 200 Torr
substrate temperature: 500° C.
thickness of growth: 200 μm (second step) conditions for growth . . . heat plasma CVD (following 1st step)
material gas
H$_2$: 10 slm
CH$_4$: 2.8 slm
He: 20 slm
F$_2$: 0.1 slm
WF$_6$: 0.2 slm
pressure: 200 Torr
substrate temperature: 500° C.
thickness of growth: 300 μm where "slm" (standard liter per minute) is a unit of gas flow. 1 slm means 1 litter of gas reduced to the standard state i.e. at 0° C. under 1 atm flows per minute.

Total thickness of the diamond was 500 μm (0.5 nm). According to the processes shown by FIG. 2, a diamond tool was made by brazing the diamond plate onto a tool body. The impurity concentration measurement was done to the first layer and the second layer.

The impurity concentration of the layers were;
(1) first layer (at 40 μm depth from the rake surface)
F . . . 0.12%
(2) second layer (at 455 μm depth from the rake surface)
W . . . 3.8%
Br . . . 1.2%
F . . . 0.22%

To estimate the cutting performance of the diamond tool, a round bar made of A390 alloy (Al—17% Si) with four axial grooves was cut by the diamond tool under the same conditions as the embodiments ①, ② and ③, without lubricant, cutting speed: 800 m/min
cutting depth: 0.2 mm
feed: 0.1 mm/rev.

The $V_b$ abrasion loss in 120 minute cutting was 30 μm. This was a very small loss. This result shows that this invention is also applicable to the heat plasma CVD method.

EMBODIMENT ⑤

Heat Plasma CVD Method

Similarly to embodiment ④, a substrate was mounted on the susceptor (44) in FIG. 8. Diamond was grown on the substrate (45) by the heat plasma CVD method comprising two steps of deposition. On the first step the material gas included no impurity. With the material gas of H$_2$ and C$_2$H$_2$, the powder of silicon carbide (SiC) with diameters of 2 μm to 5 μm was introduced into the chamber on the second step as an impurity.

(first step) condition of growth . . . heat plasma CVD
material gas

H₂: 10 slm
C₂H₂: 0.5 slm
pressure: 50 Torr
substrate temperature: 850° C.
thickness of growth: 300 μm
(second step) condition of growth . . . heat plasma CVD
(following 1st step)
material gas
H₂: 10 slm
C₂H₂: 5 slm
SiC powder: 0.2 g/min
pressure: 400 Torr
substrate temperature: 980° C.
thickness of growth: 1000 μm The polycrystalline diamond plate was brazed on a tool body according to the processes shown in FIG. 2. The impurity concentration of the layers was measured.
first layer (at a point distanced by 60 μm from the rake surface)
undetectable (less than 3 ppm)
second layer (at a point distanced by 900 μm from the rake surface)
Si . . . 9%

The cutting test similar to embodiment ④ was done for the tool to estimate the cutting performance. The $V_b$ abrasion loss in 90 minute cutting was 16 μm. This is very little loss. This result shows that powder instead of gas is available for impurity.

EMBODIMENT ⑥

Filament CVD Method

Similarly to embodiment ①, a substrate was mounted on the susceptor (12) in FIG. 5. Diamond was grown on the substrate by the filament CVD method comprising two steps of deposition for changing the impurity ratio in the material gas. No impurity was included in the material gas of the first step. The second step used a material gas with high ratio of hydrocarbon gas in order to grow such diamond having much non-crystalline diamond carbon ingredient.
(first step) condition of growth . . . filament CVD
material gas
H₂: 1000 sccm
CH₄: 8 sccm
pressure: 120 Torr
W filament temperature: 2150° C.
substrate temperature: 800° C.
thickness of growth: 150 μm
(second step) condition of growth . . . filament CVD
(following 1st step)
material gas
H₂: 1000 sccm
C₂H₂: 50 slm
pressure: 80 Torr
W filament temperature: 2450° C.
substrate temperature: 980° C.
thickness of growth: 800 μm A tool was fabricated by brazing the diamond plate to an end of a tool body according to the processes of FIG. 2. The impurity concentration of each layer was calculated from the results of measurement of specific gravity of the diamond plate, assuming that the specific gravity of crystalline diamond is 3.52 g/cm³.
first layer (at a point distanced by 30 μm from the rake surface)

non-diamond carbon ingredient less than 0.05%
second layer (at a point distanced by 750 μm from the rake surface)
non-diamond carbon Ingredient . . . 2%~6%
metal impurity . . . W: 0.1% (IMA)

The cutting test similar to embodiment ④ was also done for the tool. The $V_b$ abrasion loss in 80 minute cutting was 18 μm. This is also very little loss. This result shows non-diamond carbon ingredient is also available for the impurity of the partial region near the fixation surface.

EMBODIMENT ⑦

Impurity Concentration at the Rake Surface

In order to investigate the optimum range of the impurity concentration at the rake surface, various samples with a rake surface having different impurity concentration were manufactured by the filament CVD method and the microwave plasma CVD method. The amount of impurity concentration was here divided into four degrees. Round bars of 4%-silicon-aluminum alloy 4% Si-Al) and round bars of 25%-silicon-aluminum alloy (25% Si-Al) were cut by the tools with different impurity concentration at the rake surface. The results are shown in Table 7.

TABLE 7

| | Cutting Performance of Tools with Different Impurity Concentration | |
|---|---|---|
| impurity concentration at rake surface | 4% Si—Al alloy | 25% Si—Al alloy |
| more than 5% | Δ (average) | x (bad) |
| 1%~5% | ○ (good) | Δ (average) |
| 1000 ppm~1% | ⊙ (better) | ○ (good) |
| less than 1000 ppm | ⊚ (best) | ⊙ (better) |

This result shows that less than 5 atomic percent of impurity concentration at the rake surface is preferable. The tool with less than 5% of impurity concentration can cut the difficult test object (25% Si-Al). More preferable impurity concentration is less than 1%. Less than 1000 ppm is the most preferable impurity concentration at the rake surface.

What we claim is:
1. A polycrystalline diamond tool comprising:
   a tool body having an edge surface; and
   a polycrystalline diamond plate having a rake surface, a fixation surface, a thickness of more than 40 μm which is defined between the rake surface and fixation surface, a first partial region defined as extending from the rake surface to a depth equal to 30% of the thickness of the diamond plate, and a second partial region defined as extending from the fixation surface to a depth equal to 30% of the thickness of the diamond plate,
   wherein the polycrystalline diamond plate includes an impurity concentration that changes in the direction of thickness so as to provide an impurity concentration ($X_0$) at the rake surface that is lower than an impurity concentration ($Y_0$) at the fixation surface, wherein there is no metal impurity at the rake surface, and wherein the polycrystalline diamond tool is formed by:
   synthesizing the polycrystalline diamond plate by a chemical vapor phase deposition method on a substrate so that the rake surface of the polycrystalline diamond plate abuts the substrate;

separating the polycrystalline diamond plate from the substrate; and affixing the fixation surface of the polycrystalline diamond plate to the edge surface of the tool body.

2. A polycrystalline diamond tool comprising:

a tool body having an edge surface; and a polycrystalline diamond plate having a rake surface, a fixation surface, a thickness of more than 40 μm which is defined between the rake surface and fixation surface, a first partial region defined as extending from the rake surface to a depth equal to 30% of the thickness of the diamond plate, and a second partial region defined as extending from the fixation surface to a depth equal to 30% of the thickness of the diamond plate, wherein the polycrystalline diamond plate includes an impurity concentration that changes in the direction of thickness so as to provide an impurity concentration $(X_1)$ in the first partial region that is lower than an impurity concentration $(Y_1)$ in the second partial region, wherein there is no metal impurity at the rake surface, and wherein the polycrystalline diamond tool is formed by:

synthesizing the polycrystalline diamond plate by a chemical vapor phase deposition method on a substrate so that the rake surface of the polycrystalline diamond plate abuts the substrate;

separating the polycrystalline diamond plate from the substrate; and affixing the fixation surface of the polycrystalline diamond plate to the edge surface of the tool body.

3. A polycrystalline diamond tool as claimed in claim 1 or 2, wherein average impurity concentration $(X_1)$ in the partial region with a depth of 30% of thickness from the rake surface is less than 5 atomic %.

4. A polycrystalline diamond tool as claimed in claim 1 or 2, wherein average impurity concentration $(X_1)$ in the partial region with a depth of 30% of thickness from the rake surface is less than 1 atomic %.

5. A polycrystalline diamond tool as claimed in claim 1 or 2, wherein the partial region near the fixation surface contains at least carbon ingredients except crystalline diamond in addition to impurities.

6. A polycrystalline diamond tool as claimed in claim 1 or 2, wherein the partial region near the fixation surface contains silicon, boron or aluminum as an impurity.

7. A polycrystalline diamond tool as claimed in claim 1 or 2, wherein the partial region near the fixation surface contains carbides, oxides, or nitrides of silicon, boron or aluminum as an impurity.

8. A polycrystalline diamond tool as claimed in claim 1 or 2, wherein the partial region near the fixation surface contains tungsten, molybdenum, iron, niobium or tantalum as an impurity.

9. A polycrystalline diamond tool as claimed in claim 1 or 2, wherein the partial region near the fixation surface contains carbides, oxides or nitrides of tungsten, molybdenum, cobalt, iron, niobium or tantalum as an impurity.

10. A polycrystalline diamond tool as claimed in claim 1 or 2, wherein the partial region near the fixation surface contains halogen as an impurity.

11. A polycrystalline diamond tool as claimed in claim 1 or 2, wherein the partial region near the fixation surface contains halogenides of Si, B, Al, Re, W, Mo or Fe as an impurity.

12. A polycrystalline diamond tool as claimed in claim 1 or 2, wherein the partial region near the fixation surface contains powder of one or more than one of metals, semimetals or non-metals in the periodic table as an impurity.

13. A polycrystalline diamond tool as claimed in claim 1 or 2, wherein the partial region near the fixation surface contains powder of one or more than one of carbides, nitrides or oxides of metals, semimetals or non-metals in the periodic table as an impurity.

14. A polycrystalline diamond tool as claimed in claim 1 or 2, wherein the fixation surface of the polycrystalline diamond plate is affixed to the edge surface of the tool body by metalizing the fixation surface of the polycrystalline diamond plate and brazing the polycrystalline diamond plate to the edge surface of the tool body.

15. A polycrystalline diamond tool as claimed in claim 1, wherein there is no metal impurity within the first partial region.

16. A polycrystalline diamond tool as claimed in claim 2, wherein there is no metal impurity within the first partial region.

17. A polycrystalline diamond tool as claimed in claim 1, wherein there is no metal impurity within a third partial region defined as extending from the rake surface to a depth of 12 μm along the thickness of the diamond plate.

18. A polycrystalline diamond tool as claimed in claim 2, wherein there is no metal impurity within a third partial region defined as extending from the rake surface to a depth of 12 μm along the thickness of the diamond plate.

* * * * *